(12) United States Patent
Huang et al.

(10) Patent No.: US 10,365,696 B1
(45) Date of Patent: Jul. 30, 2019

(54) INDUSTRIAL INPUT/OUTPUT DEVICE WITH MOVABLE CONNECTOR

(71) Applicant: MOXA INC., New Taipei (TW)

(72) Inventors: Yi-Chun Huang, New Taipei (TW); Chung-Kun Hou, New Taipei (TW)

(73) Assignee: MOXA INC., New Taipei (TW)

( * ) Notice: Subject to any disclaimer, the term of this patent is extended or adjusted under 35 U.S.C. 154(b) by 0 days.

(21) Appl. No.: 16/143,544

(22) Filed: Sep. 27, 2018

(51) Int. Cl.
| | |
|---|---|
| *H05K 7/00* | (2006.01) |
| *G06F 1/18* | (2006.01) |
| *H01R 9/26* | (2006.01) |
| *H05K 7/14* | (2006.01) |
| *H01R 4/48* | (2006.01) |

(52) U.S. Cl.
CPC ............. *G06F 1/186* (2013.01); *G06F 1/185* (2013.01); *H01R 4/4818* (2013.01); *H01R 9/2675* (2013.01); *H05K 7/1468* (2013.01)

(58) Field of Classification Search
None
See application file for complete search history.

(56) References Cited

U.S. PATENT DOCUMENTS

| | | | | |
|---|---|---|---|---|
| 4,683,515 A | * | 7/1987 | Beihoff | H02H 3/085 361/106 |
| 4,791,361 A | * | 12/1988 | Beihoff | G01R 15/205 324/117 H |
| 5,198,793 A | * | 3/1993 | Leveque | H05K 1/0284 200/522 |
| 5,652,420 A | * | 7/1997 | Innes | H01H 71/02 200/307 |
| 5,904,592 A | * | 5/1999 | Baran | H02B 1/052 361/627 |
| 6,034,584 A | * | 3/2000 | Hilfiker | H01H 11/0031 335/132 |
| 6,331,935 B1 | * | 12/2001 | Baran | G06F 1/1632 361/679.41 |
| 6,661,671 B1 | * | 12/2003 | Franke | G06F 1/189 361/679.02 |
| 7,064,951 B2 | * | 6/2006 | Barile | G06F 1/186 248/917 |
| 7,116,538 B2 | * | 10/2006 | Haensgen | H01H 71/0228 361/93.1 |
| 7,609,528 B2 | * | 10/2009 | Freimuth | H01R 9/2616 361/732 |
| 8,149,587 B2 | * | 4/2012 | Baran | H05K 7/1485 180/233 |
| 2012/0158160 A1 | * | 6/2012 | Baran | H05K 7/1485 700/83 |

* cited by examiner

*Primary Examiner* — Courtney L Smith
*Assistant Examiner* — Rashen E Morrison
(74) *Attorney, Agent, or Firm* — Chih Feng Yeh; Huntington IP Consulting Co., Ltd.

(57) ABSTRACT

An industrial input/output device with movable connector is provided. The industrial input/output device with movable connector is controlled to make the first connector provide connection or not by moving a moving link thereof. Therefore, the technical effect of preventing the interruption of the operation of the industrial input/output device can be achieved.

9 Claims, 27 Drawing Sheets

INDUSTRIAL INPUT/OUTPUT DEVICE WITH MOVABLE CONNECTOR

BACKGROUND

Technical Field

The invention relates to an industrial input/output device. In particular, the invention pertains to an industrial input/output device with movable connector, which is controlled to make a first connector provide connection or not by moving a moving link thereof.

Related Art

Generally, there are two assembly methods for assembling industrial input/output devices, one assembly method is to provide a back plate and the industrial input/output devices are plugged on the back plate for assembly and further control; other assembly method is to dispose a series interface on the industrial input/output device, so that the industrial input/output devices can be connected in series with each other through the series interfaces, without using the back plate, thereby assembling the industrial input/output devices for further control.

U.S. Patent Application Pub. No. US20150154136A1 discloses an input/output module with multi-channel switching capability, wherein the input/output modules can be connected on a back plate for assembly and further control of the industrial input/output devices.

U.S. Pat. No. 5,716,241 A discloses an input/output device for a data bus, wherein the input/output device includes a plurality of electrical connection contacts disposed on two sides thereof, so that the industrial input/output devices can be connected with each other in series through the electrical connection contacts, for assembly and further control.

However, the assembly method using the back plate may have a problem of occupying more space; and the assembly method using series interface may reduce the occupied space, but it may have a problem that the existing industrial input/output device with serial interface can be extracted at any time, thereby causing the operation of the industrial input/output device to be interrupted.

Therefore, what is need is to provide a technical solution to solve the conventional technology problem that the existing industrial input/output device with serial interface can be extracted at any time, thereby causing the operation of the industrial input/output device to be interrupted.

SUMMARY

In view of the prior art, there is a problem that the existing industrial input/output device with the serial interface can be extracted at any time to cause the operation of the industrial input/output device to be interrupted, so that the present invention provides an industrial input/output device with movable connector.

According to one embodiment, the present invention provides an industrial input/output device with movable connector, and the industrial input/output device with movable connector includes a first housing, a second housing, a circuit board, a moving link, and a first connector.

The first housing has a first connector through hole, a first concave portion, a moving-link setting portion, and a plurality of moving guides on an inner surface thereof.

The second housing may be assembled with the first housing, and has an accommodation space, a second connector through hole, and a second concave portion, wherein a position of the second connector through hole corresponds to that of the first connector through hole.

The circuit board is disposed in the accommodation space, and provided with a second connector, which is exposed to the second housing through the second connector through hole when the circuit board is disposed in the accommodation space.

The moving link is set on the first housing by passing through the moving-link setting portion, and moved relative to the first housing by the moving-link setting portion and the plurality of moving guides, and has a connector setting portion, which has two sets of guiding movement grooves provided on both sides thereof, and a connecting through hole, which is provided at a bottom thereof.

The first connector has setting members, and a number and positions of the setting members correspond to those of the guiding movement grooves, wherein the setting members are disposed in the guiding movement grooves corresponding thereto to make the first connector be disposed in the connector setting portion, and the first connector is exposed to the first housing when the moving link is set on the first housing by passing through the moving-link setting portion, and the first connector electrically connects to the circuit board through the connecting through hole.

The moving link is disposed on the first housing, the second housing and the first housing are assembled with each other as a device housing, the first concave portion and the second concave portion form a cavity, a first operation end of the moving link is disposed to the cavity, and a second operation end of the moving link is disposed to the moving-link setting portion.

As described above, and the difference between the conventional technology and the present invention is that the industrial input/output device with movable connector is controlled to make the first connector provide connection or not by moving the moving link thereof, thereby avoiding the problem of the interruption of the operation of the industrial input/output device.

By aforementioned technology means, the present invention may achieve the technical effect of preventing the interruption of the operation of the industrial input/output device.

BRIEF DESCRIPTION OF THE DRAWINGS

The invention will become more fully understood from the detailed description given herein below illustration only, and thus is not limitative of the present invention, and wherein.

DETAILED DESCRIPTION

Figure 1A:
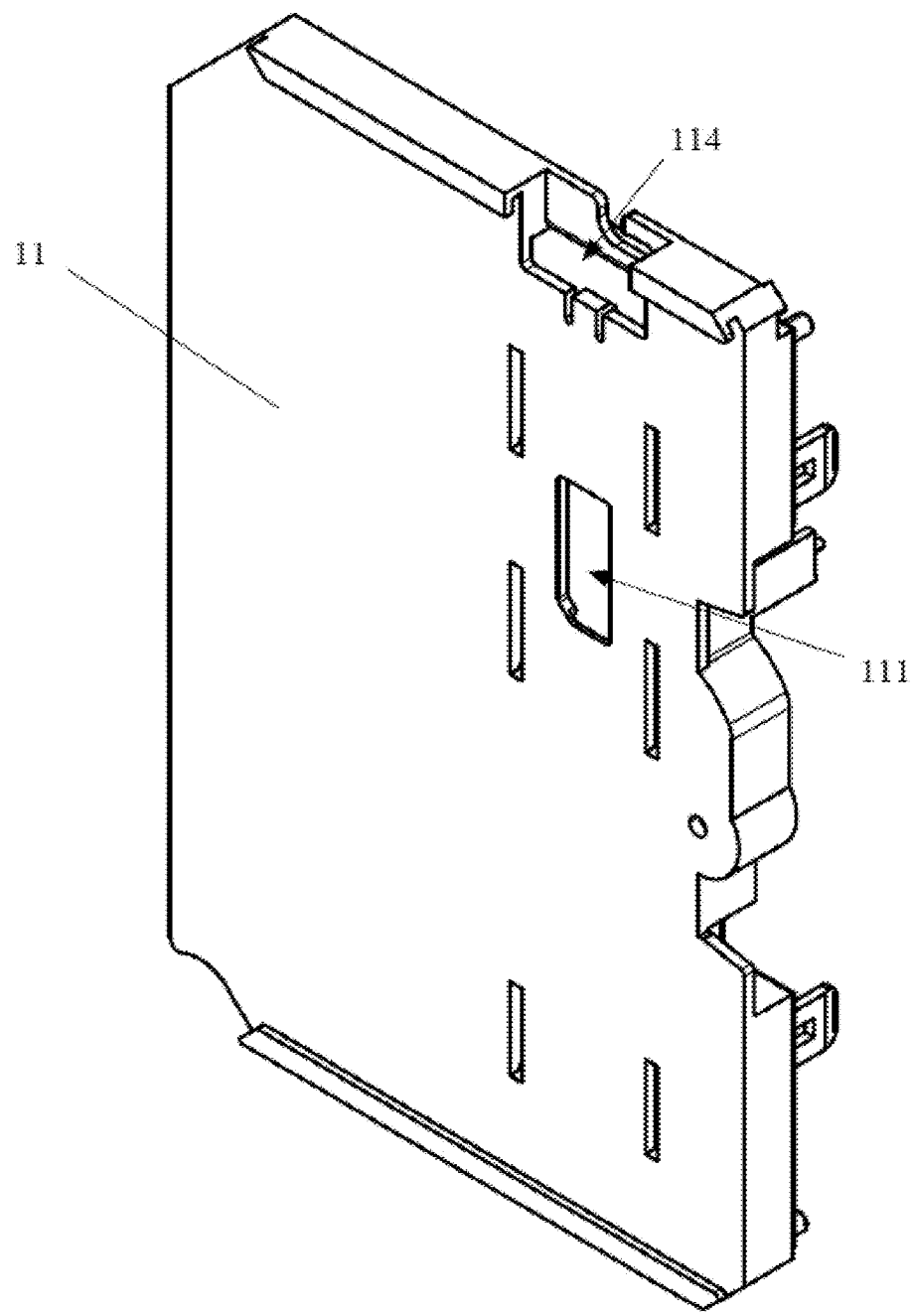
FIG. 1A is a three-dimensional view of a first housing of an industrial input/output device with movable connector of the present invention from a first perspective.

The following embodiments of the present invention are herein described in detail with reference to the accompanying drawings. These drawings show specific examples of the embodiments of the present invention. It is to be understood that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be understood that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present invention. As used herein, the term "or" includes any and all combinations of one or more of the associated listed items.

Figure 1B:
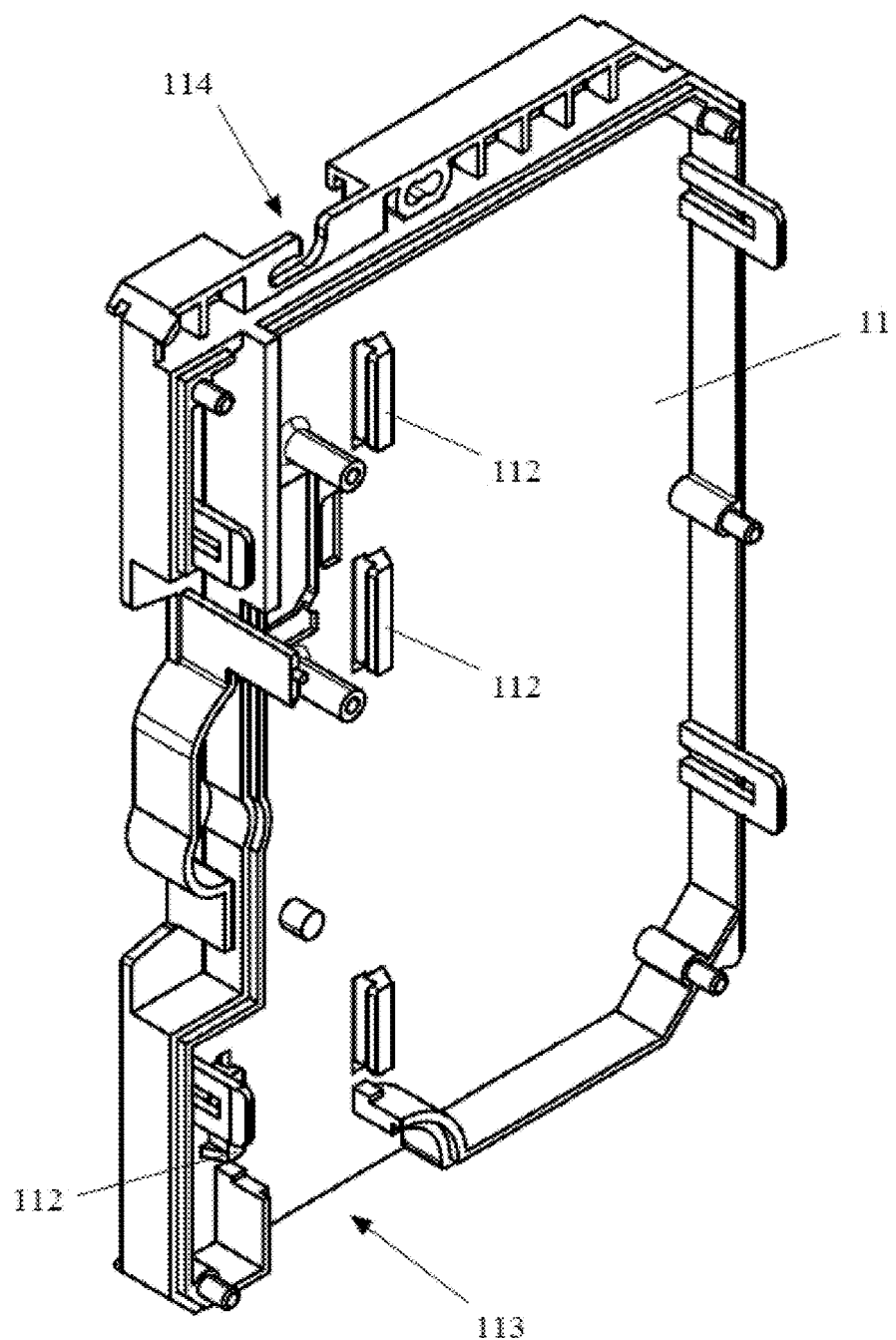
FIG. 1B is a three-dimensional view of the first housing of the industrial input/output device with movable connector of the present invention from a second perspective.

Please refer to FIG. 1A and FIG. 1B, wherein FIG. 1A is a three-dimensional view of a first housing of an industrial input/output device with movable connector of the present invention from a first perspective, and FIG. 1B is a three-dimensional view of the first housing of the industrial input/output device with movable connector of the present invention from a second perspective.

The first housing 111 has a first connector through hole 111. The first housing 111 has a plurality of moving guides 112 on an inner surface thereof. In FIG. 1B, as an illustration, there are six moving guides 112, and every two of moving guides 112 oppose the other two with each other, and the present invention is not limited thereto. For example, there are also be more than six moving guides 112 or less than six moving guides 112, and the moving guides 112 may be in a staggered arrangement (that is, there is no moving guide 112 opposing with each other), or every two of one part of moving guides 112 oppose the other two with each other and the other part of moving guides 112 are in a staggered arrangement, wherein the interval between the moving guides 112 is the width of the moving link to be mentioned later.

The first housing 11 has a first concave portion 113. In FIG. 1B, the first concave portion 113 is a space formed by assembling a vertical housing and an arc housing, and the vertical housing and the arc housing correspond to each other, and the interval between the vertical housing and the arc housing is the width of the moving link to be mentioned later.

The first housing 11 has a moving-link setting portion 114, and the moving-link setting portion 114 is in the form of a concave hole. The moving-link setting portion 114 presented in the FIG. 1A is only a schematic illustration, and the present invention is not limited thereto.

Figure 2A:
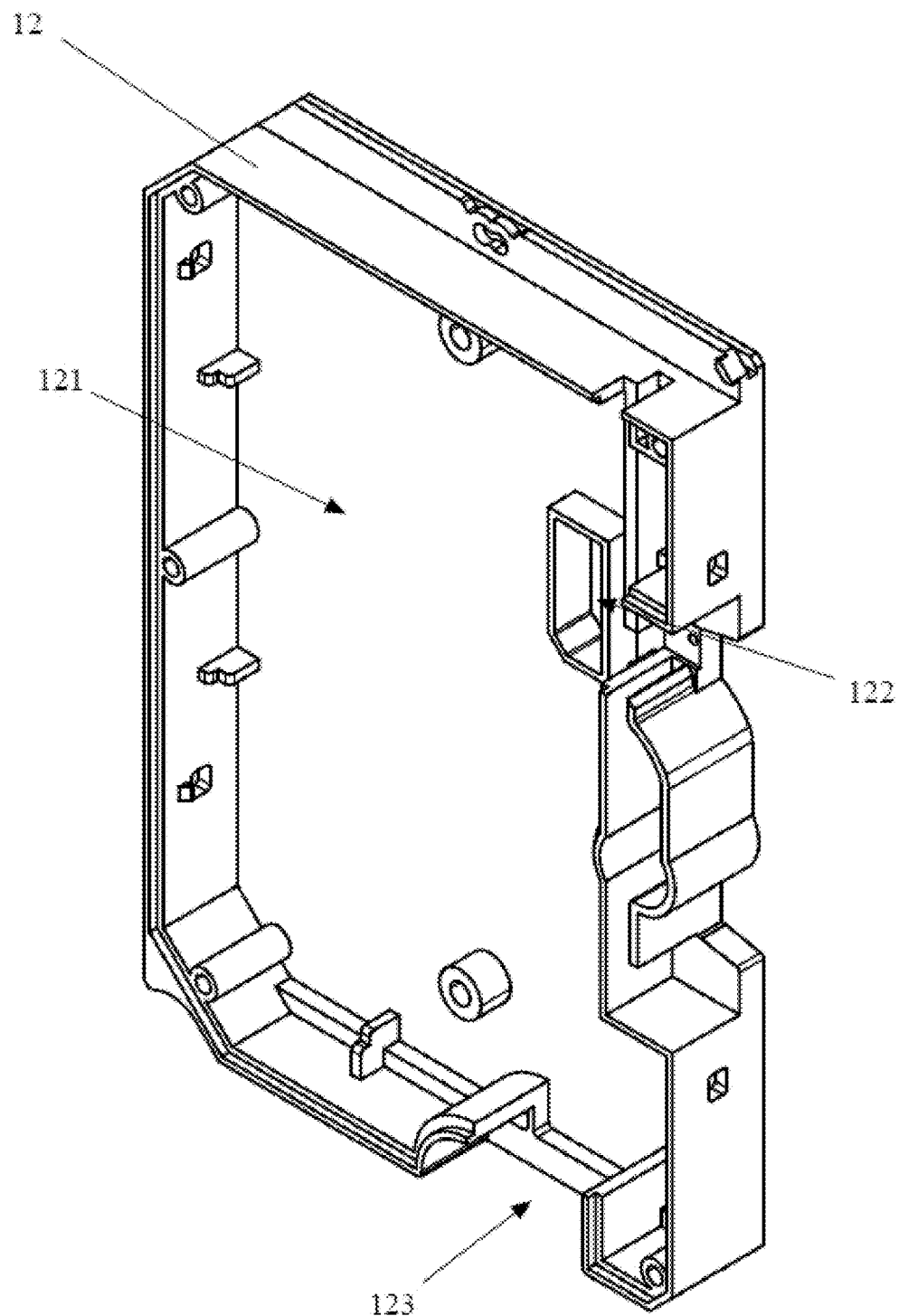
FIG. 2A is a three-dimensional view of a second housing of the industrial input/output device with movable connector of the present invention from a first perspective.
Figure 2B:
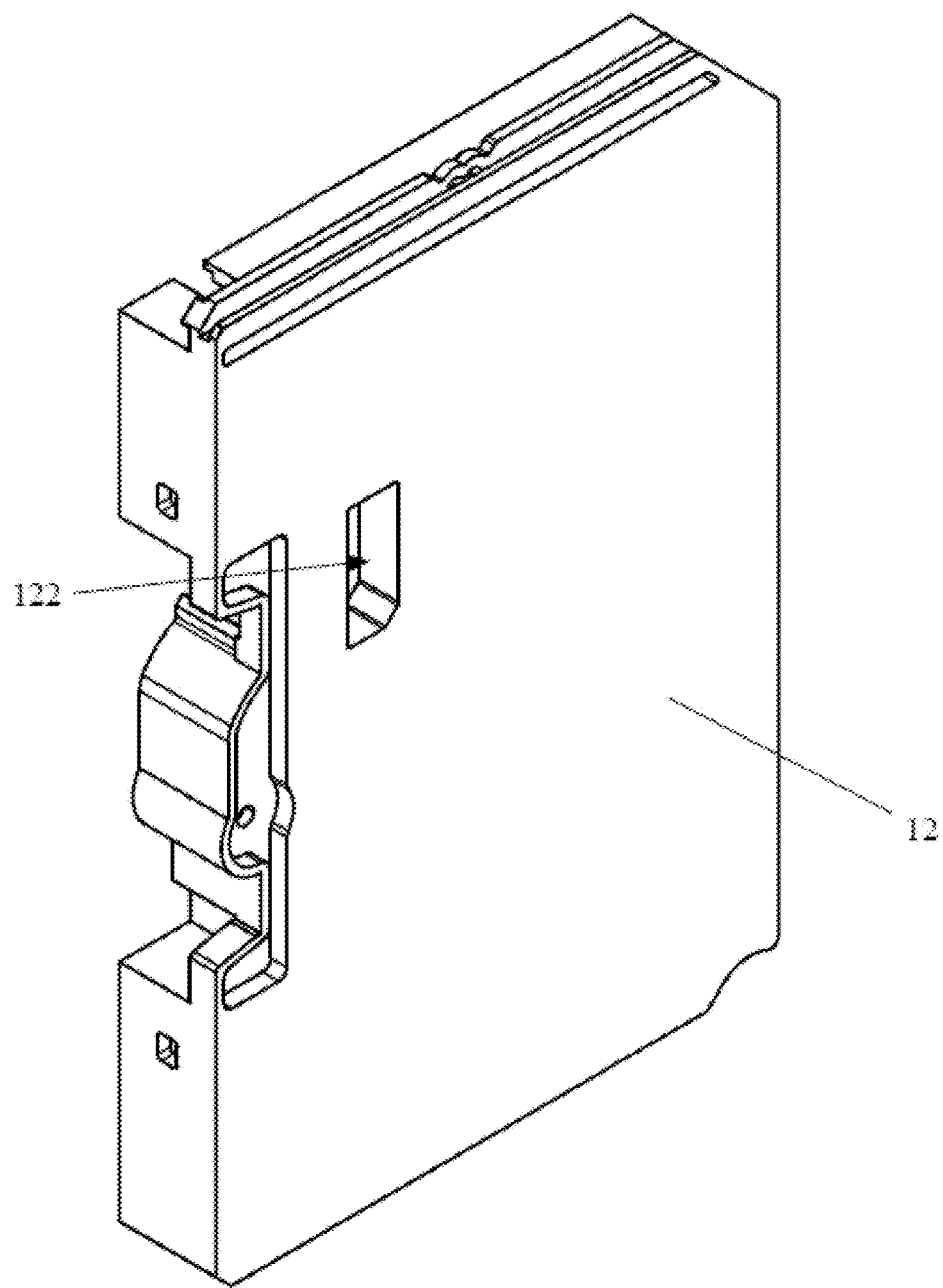
FIG. 2B is a three-dimensional view of the second housing of the industrial input/output device with movable connector of the present invention from a second perspective.
Figure 3A:
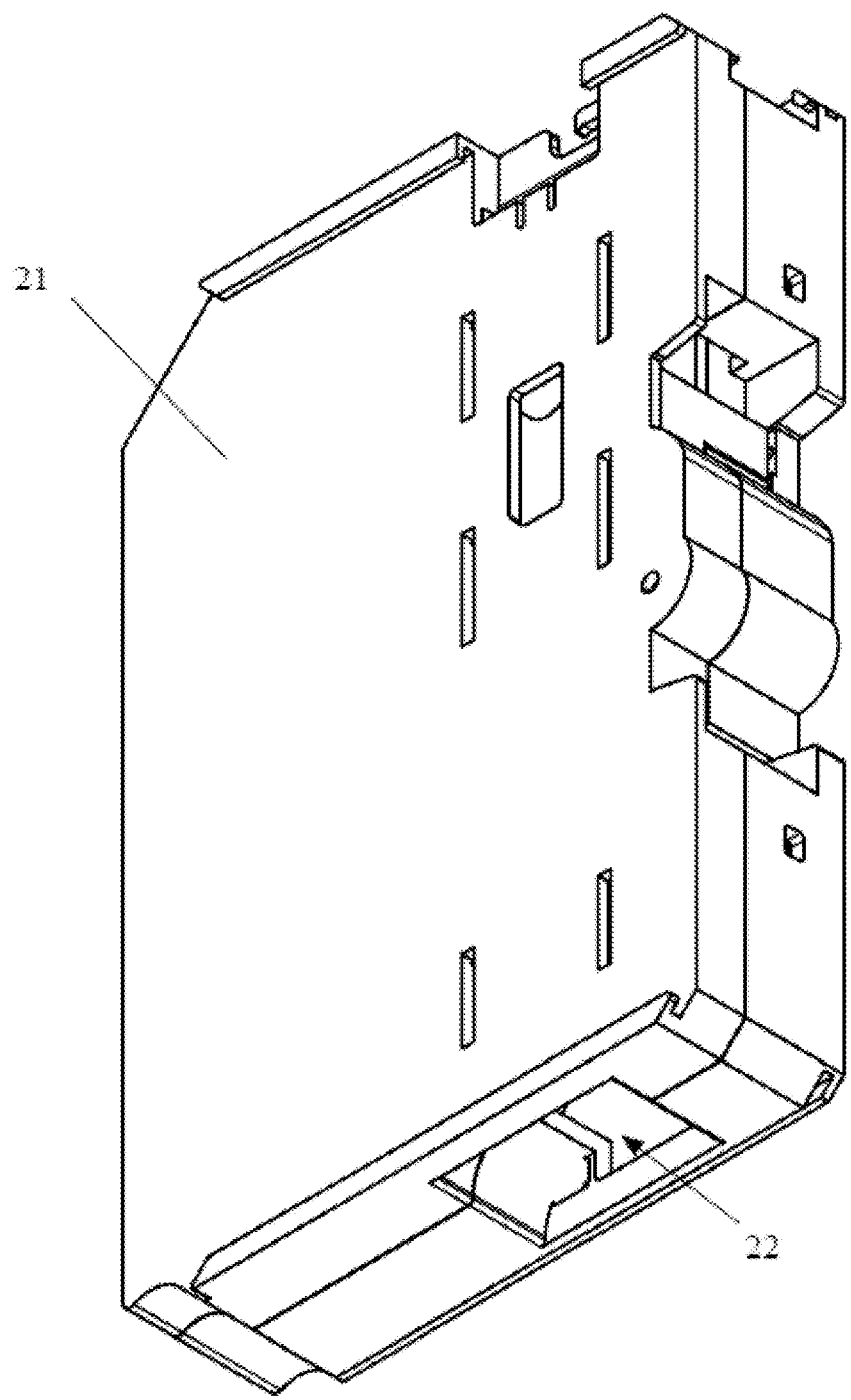
FIG. 3A is a three-dimensional view of assembling the first housing and the second housing of the industrial input/output device with movable connector of the present invention to form a device housing from a first perspective.
Figure 3B:
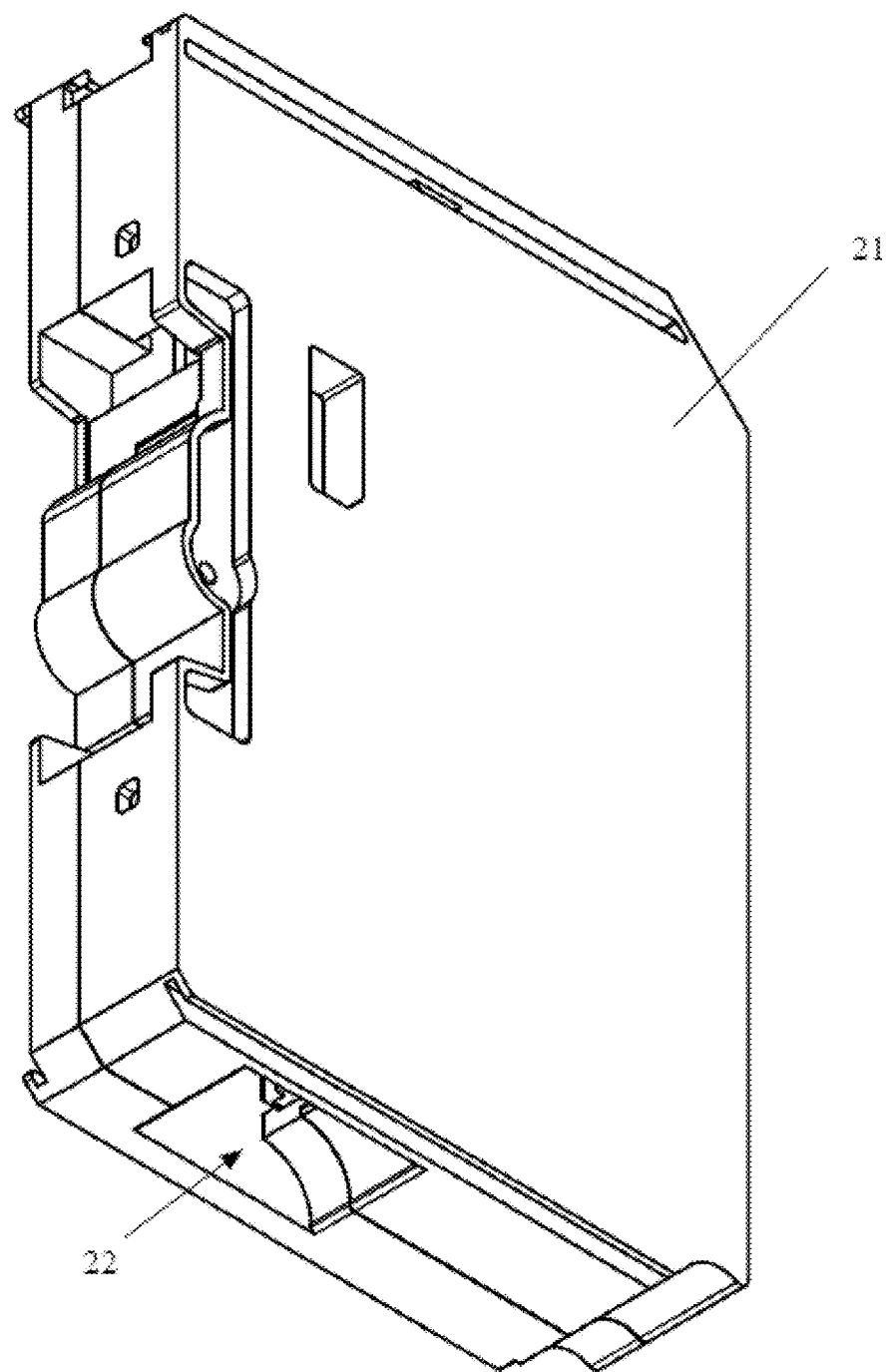
FIG. 3B is a three-dimensional view of assembling the first housing and the second housing of the industrial input/output device with movable connector of the present invention to form the device housing from a second perspective.

Please refer to FIG. 2A, FIG. 2B, FIG. 3A and FIG. 3B, wherein FIG. 2A is a three-dimensional view of a second housing of the industrial input/output device with movable connector of the present invention from a first perspective; FIG. 2B is a three-dimensional view of the second housing of the industrial input/output device with movable connector of the present invention from a second perspective; FIG. 3A is a three-dimensional view of assembling the first housing and the second housing of the industrial input/output device with movable connector of the present invention to form a device housing from a first perspective; and FIG. 3B is a three-dimensional view of assembling the first housing and the second housing of the industrial input/output device with movable connector of the present invention to form the device housing from a second perspective.

The second housing 12 has an accommodation space 121. The accommodation space 121 of the second housing 12 is for accommodating a circuit board to be mentioned later. The second housing 12 has a second connector through hole 122, and a position of the second connector through hole 122 corresponds to that of the first connector through hole 111, and the second connector through hole 122 of the second housing 12 arranged by the above-mentioned setting allows a second connector to be mentioned later to be set and make the second connector be plugged by the first connector of another industrial input/output device to form an electrical connection.

The second housing 12 has a second concave portion 123. In FIG. 2B, the second concave portion 123 is a space formed by assembling a vertical housing and an arc housing, and the vertical housing and the arc housing correspond to each other, and the interval between the vertical housing and the arc housing is the width of the moving link to be mentioned later.

The second housing 12 and the first housing 11 can be assembled with each other as a device housing 21 shown in FIG. 3A and FIG. 3B. In the assembly of the second housing 12 and the first housing 11, the first concave portion 113 and the second concave portion 123, which corresponds to each other, may be combined to form a cavity 22. The cavity 22 shown in FIG. 3B is also an operation space formed by assembling the vertical housing and the arc housing of the first housing 11 and the vertical housing and the arc housing of the second housing 12. The operation space is used to provide operation of the moving link to be mentioned later.

Figure 4:
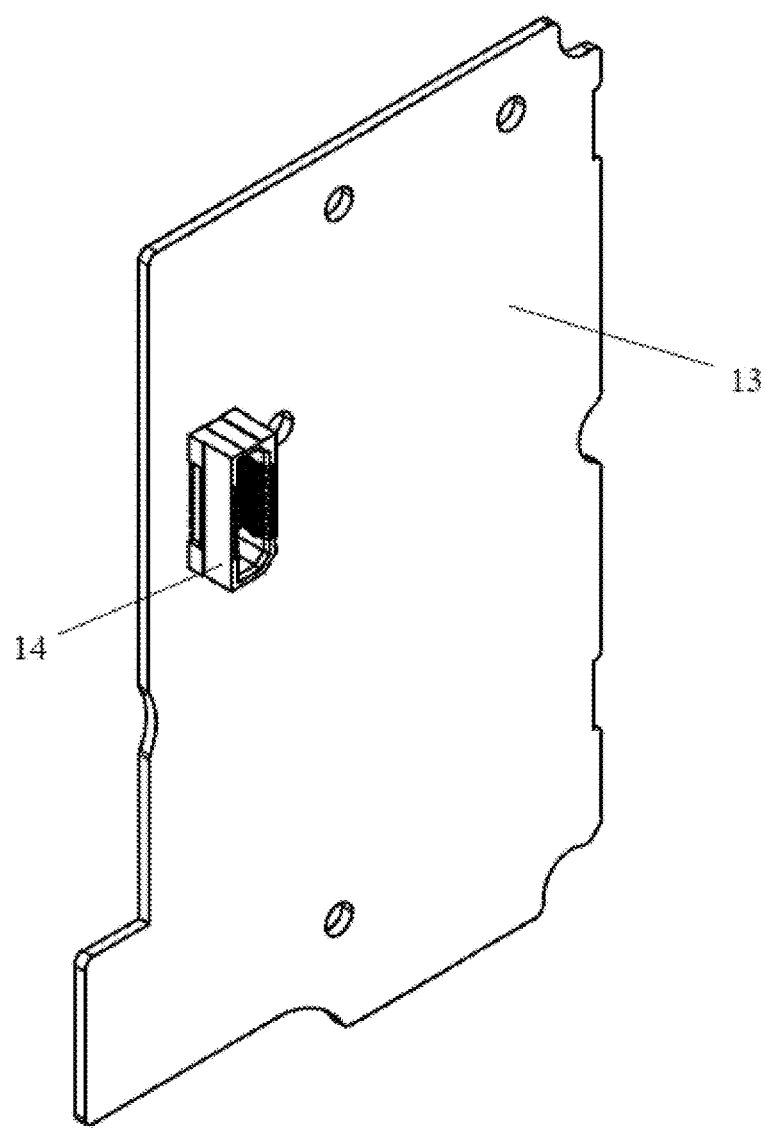
FIG. 4 is a three-dimensional view of a circuit board of the industrial input/output device with movable connector of the present invention.

Please refer to FIG. 4, which is a three-dimensional view of a circuit board of the industrial input/output device with movable connector of the present invention. The circuit board 13 is disposed in the accommodation space 121 of the second housing 12. The second connector 14 is disposed on the circuit board 13. When the circuit board 13 is disposed in the accommodation space 121 of the second housing 12, the second connector 14 on the circuit board 13 is set by the second connector through hole 122 and is plugged by the first connector of another industrial input/output device to form an electrical connection.

Figure 5A:
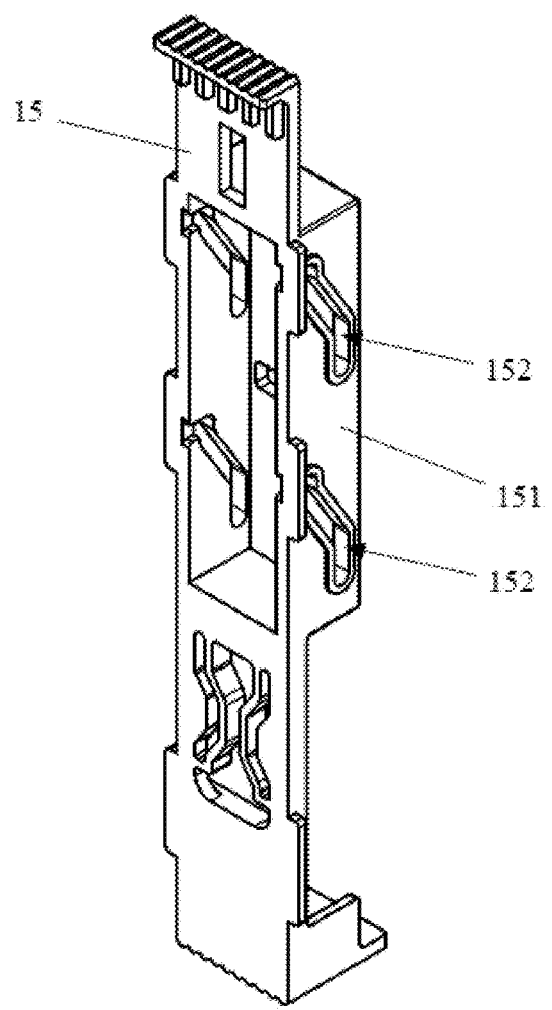
FIG. 5A is a three-dimensional view of a moving link of the industrial input/output device with movable connector of the present invention from a first perspective.
Figure 5B:
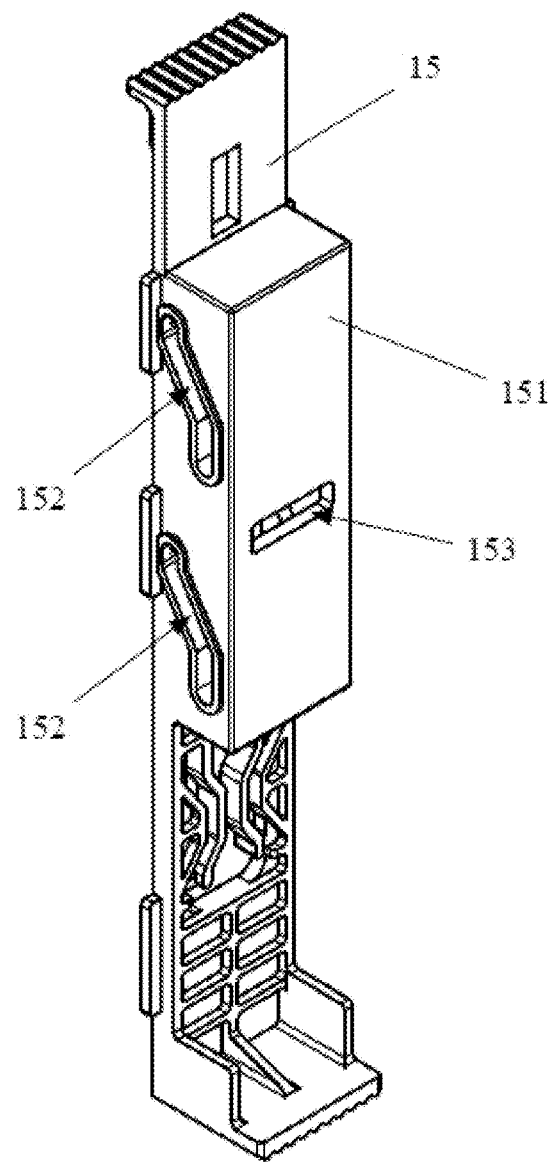
FIG. 5B is a three-dimensional view of the moving link of the industrial input/output device with movable connector of the present invention from a second perspective.

Please refer to FIG. 5A and FIG. 5B, wherein FIG. 5A is a three-dimensional view of a moving link of the industrial input/output device with movable connector of the present invention from a first perspective, and FIG. 5B is a three-dimensional view of the moving link of the industrial input/output device with movable connector of the present invention from a second perspective.

The moving link 15 has a connector setting portion 151, the connector setting portion 151 is in the shape of a groove, and the connector setting portion 151 is for accommodating a first connector housing to be mentioned later. The setting portion 151 has two sets of guiding movement grooves 152 disposed on both sides thereof, and the guiding movement grooves 152 are for accommodating the first connector to be mentioned later and guiding the movement of the first connector to be mentioned later. It is noted that each guiding movement groove 152 is a track with horizontal planes at both ends and an inclined plane in the middle, so that the guiding movement groove 152 provides the technical effect that the moving direction of the moving link 15 and the moving direction of the first connector to be mentioned later are perpendicular to each other.

The connector setting portion 151 has a connecting through hole 153 provided at a bottom thereof, and the first connector accommodated in the connector setting portion 151 can electrically connect to the circuit board 13 disposed in the accommodation space 121 of the second housing 12 through the connecting through hole 153 at the bottom of the connector setting portion 151, and the first connector can be electrically connected to the circuit board 13 through wires, connecting lines, cables, etc., and here is only an example, it does not limit the scope of application of the present invention.

Figure 6A:
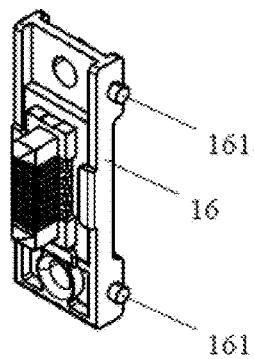
FIG. 6A is a three-dimensional view of a first connector of the industrial input/output device with movable connector of the present invention from a first perspective.
Figure 6B:
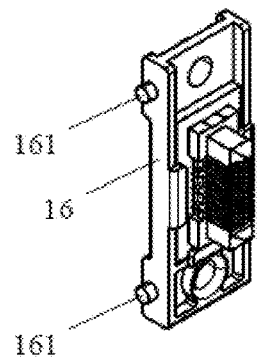
FIG. 6B is a three-dimensional view of the first connector of the industrial input/output device with movable connector of the present invention from a second perspective.
Figure 7A:
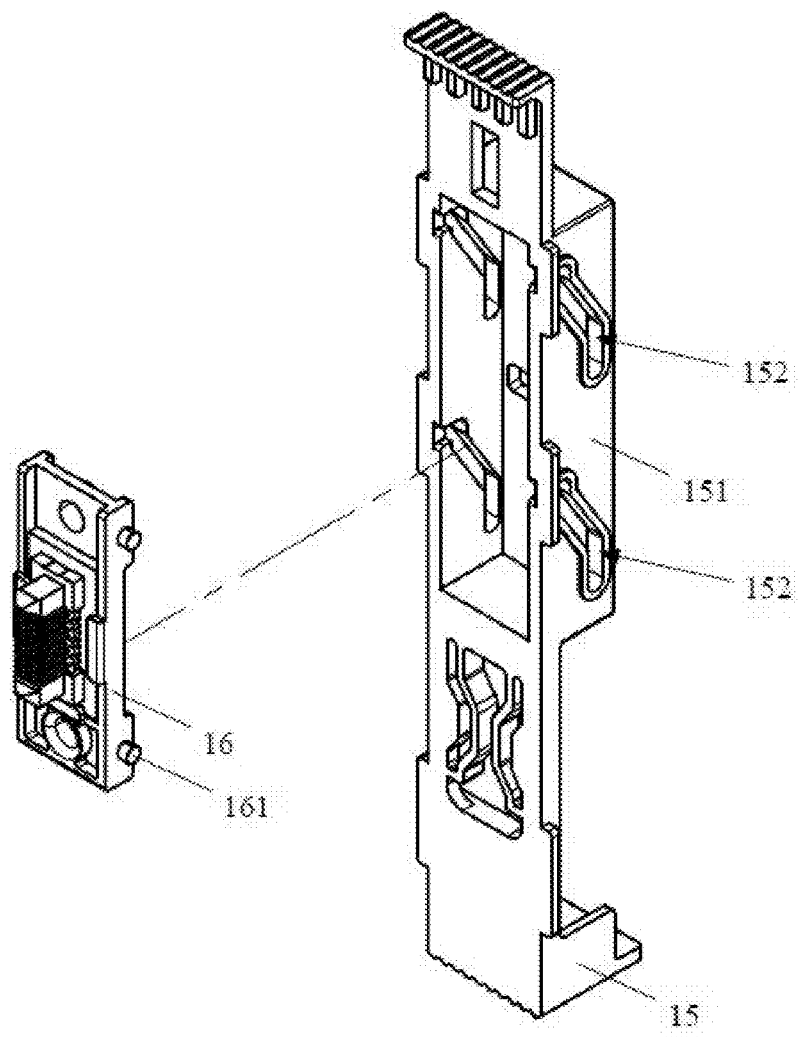
FIG. 7A is a three-dimensional view of separating the moving link and the first connector of the industrial input/output device with movable connector of the present invention assembled together.
Figure 7B:
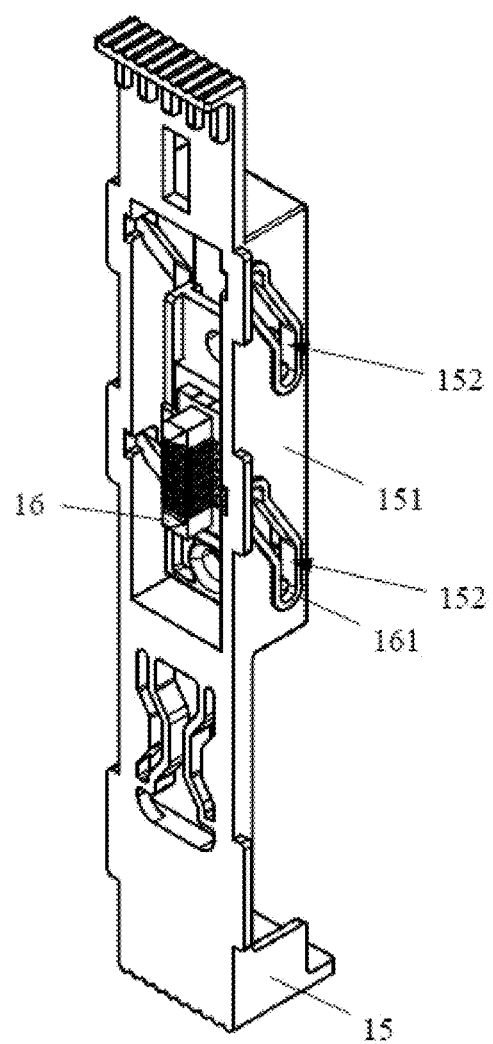
FIG. 7B is a three-dimensional view of assembling the moving link and the first connector of the industrial input/output device with movable connector of the present invention.

Please refer to FIG. 6A, FIG. 6B, FIG. 7A and FIG. 7B, wherein FIG. 6A is a three-dimensional view of a first connector of the industrial input/output device with movable connector of the present invention from a first perspective; FIG. 6B is a three-dimensional view of the first connector of the industrial input/output device with movable connector of the present invention from a second perspective; FIG. 7A is a three-dimensional view of separating the moving link and the first connector of the industrial input/output device with movable connector of the present invention assembled together; and FIG. 7B is a three-dimensional view of assembling the moving link and the first connector of the industrial input/output device with movable connector of the present invention.

The first connector 16 has setting members 161, a number and positions of which correspond to those of the guiding movement grooves 152. Since the number of the guiding movement grooves 152 of the connector setting portion 151 is four, there are four setting members 161 of the first connector 16 disposed on the corresponding positions of the guiding movement grooves 152 of the connector setting portion 151 respectively, and each setting member 161 is disposed in the guiding movement groove 152 corresponding thereto to set the first connector 16 in the connector setting portion 151, thereby assembling the first connector 16 in the moving link 15.

Figure 8A:
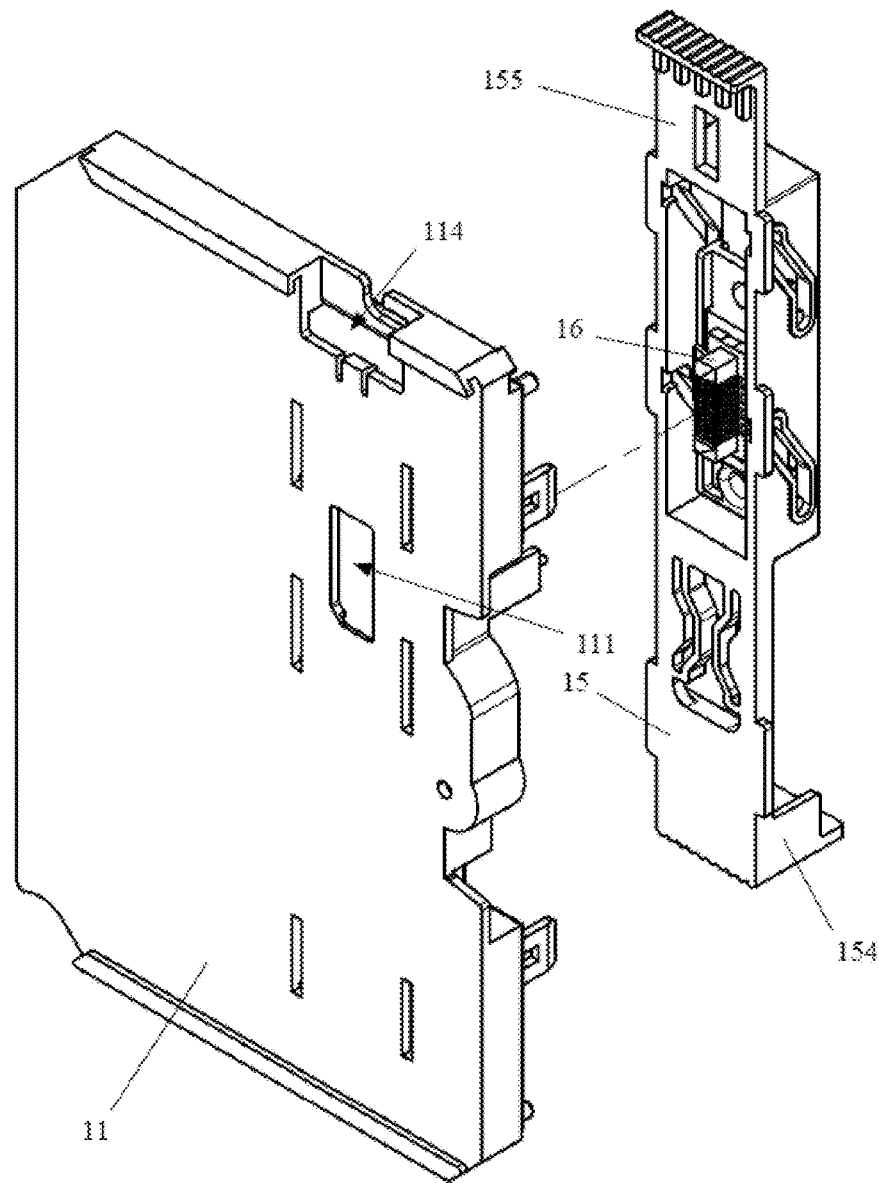
FIG. 8A is a three-dimensional view of separating the moving link and the first housing of the industrial input/output device with movable connector of the present invention assembled together.
Figure 8B:
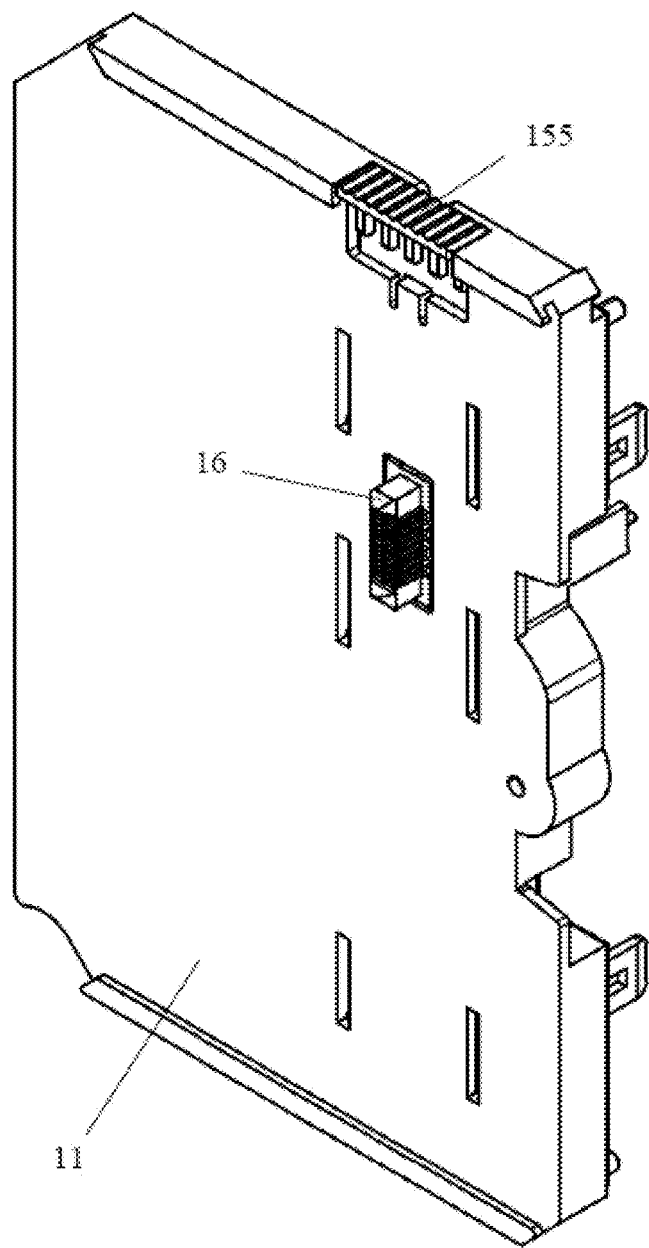
FIG. 8B is a three-dimensional view of assembling the moving link and the first housing of the industrial input/output device with movable connector of the present invention from a first perspective.
Figure 8C:
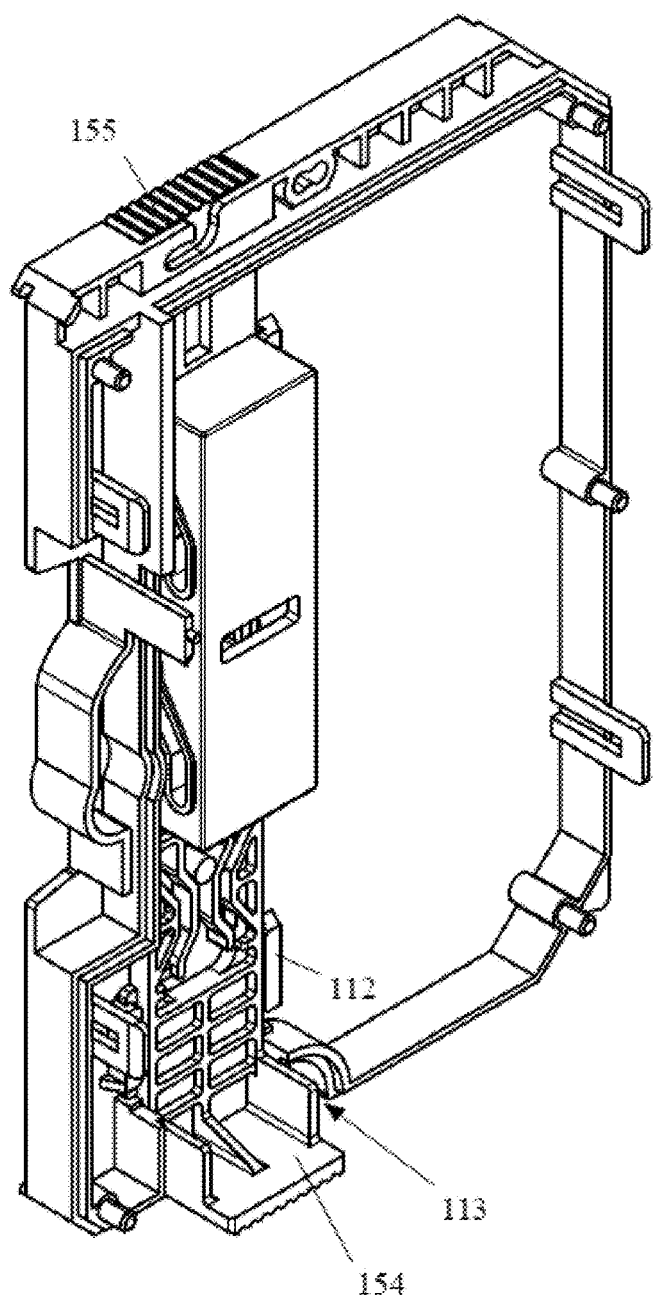
FIG. 8C is a three-dimensional view of assembling the moving link and the first housing of the industrial input/output device with movable connector of the present invention from a second perspective.
Figure 9A:
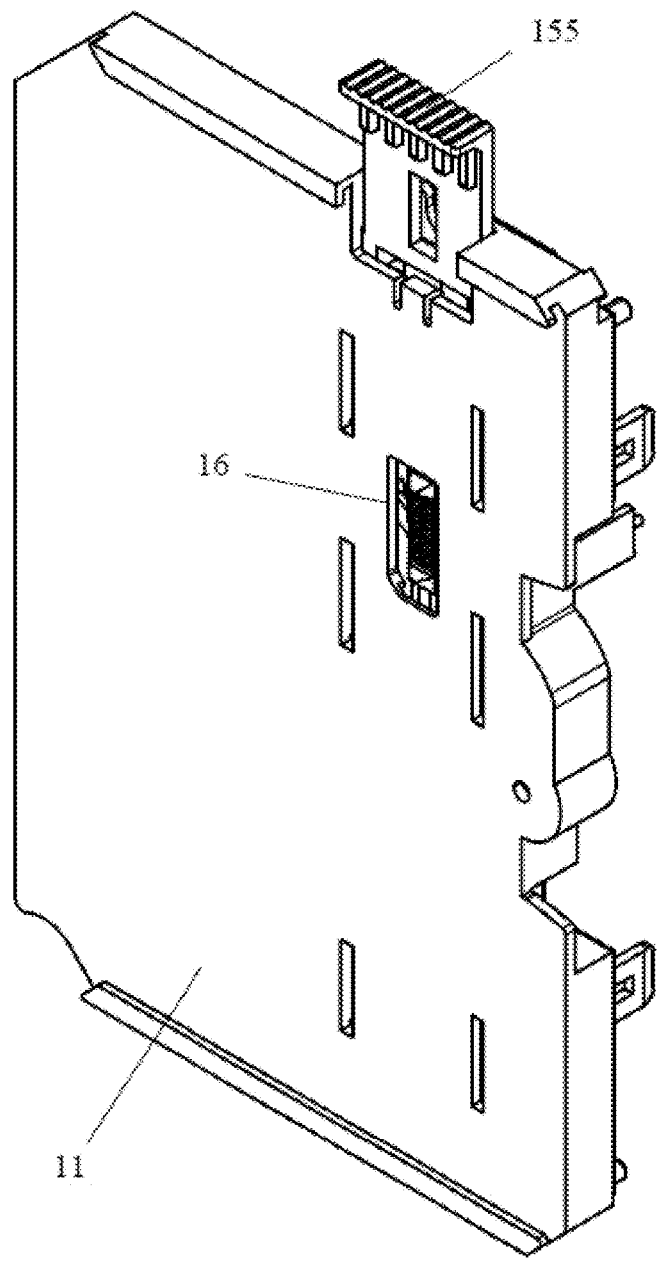
FIG. 9A is a three-dimensional view of moving the moving link of the industrial input/output device with movable connector of the present invention from a first perspective.
Figure 9B:
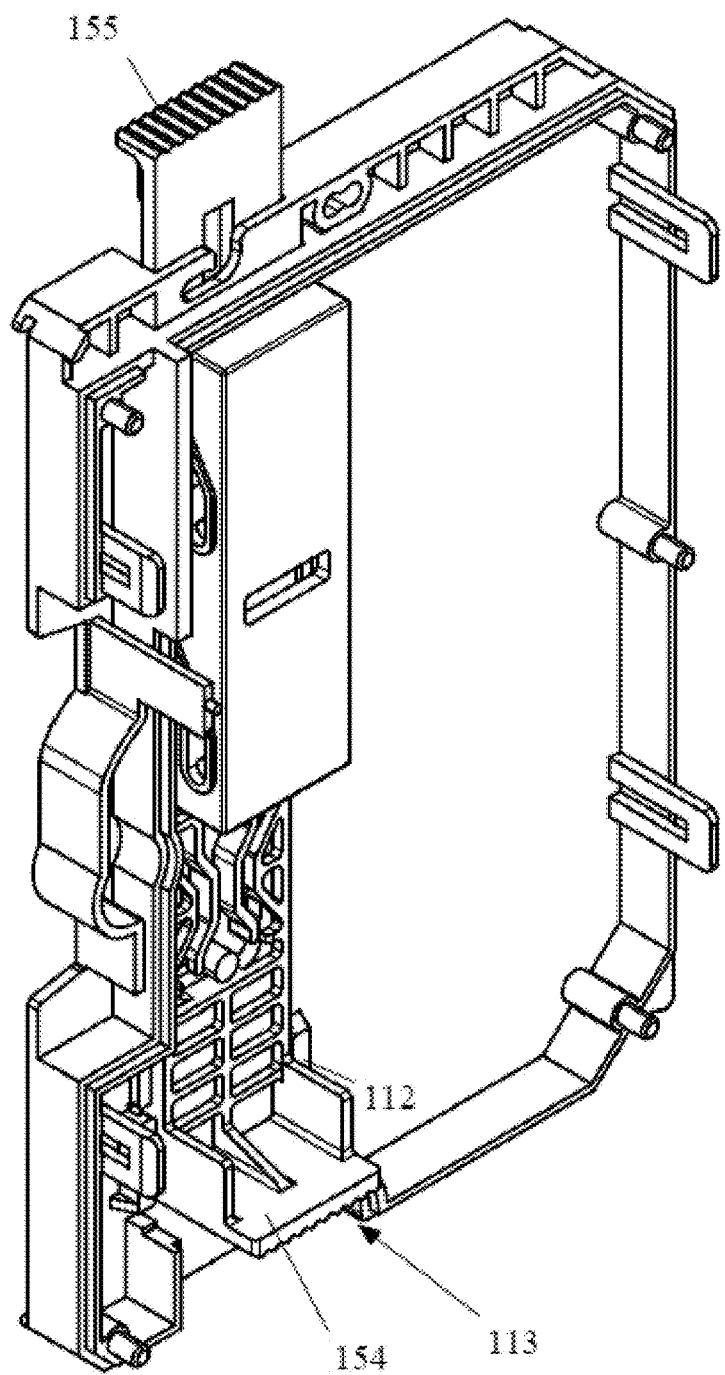
FIG. 9B is a three-dimensional view of moving the moving link of the industrial input/output device with movable connector of the present invention from a second perspective.

Please refer to FIG. 8A, FIG. 8B, FIG. 8C, FIG. 9A and FIG. 9B, wherein FIG. 8A is a three-dimensional view of separating the moving link and the first housing of the industrial input/output device with movable connector of the present invention assembled together; FIG. 8B is a three-dimensional view of assembling the moving link and the first housing of the industrial input/output device with movable connector of the present invention from a first perspective; FIG. 8C is a three-dimensional view of assembling the moving link and the first housing of the industrial input/output device with movable connector of the present invention from a second perspective; FIG. 9A is a three-dimensional view of moving the moving link of the industrial input/output device with movable connector of the present invention from a first perspective; and FIG. 9B is a three-dimensional view of moving the moving link of the industrial input/output device with movable connector of the present invention from a second perspective.

The moving link 15 is disposed between the moving guides 112 of the first housing 11 by passing through the moving-link setting portion 114 of the first housing 11, and restricts the position and movement of the moving link 15 by the moving-link setting portion 114 of the first housing 11 and the moving guides 112 of the first housing 11. That is, the moving link 15 can move only relative to the first housing 11 in a fixed moving direction.

The moving link 15 has a first operation end 154 and a second operation end 155. In FIG. 8B and FIG. 8C, when the moving link 15 is disposed between the moving guides 112 of the first housing 11 by passing through the moving-link setting portion 114 of the first housing 11, the second operation end 155 of the moving link 15 is disposed on the moving-link setting portion 114 of the first housing 11 and the first operation end 154 of the moving link 15 is disposed in the first concave portion 113 of the first housing 11 (It's worth noting that when the first housing 11 and the second housing 12 are assembled as the device housing 21, the first operation end 154 of the moving link 15 is disposed in the cavity 22 of the device housing 21).

When the first operation end 154 of the moving link 15 is pushed into the first concave portion 113 of the first housing 11 or the second operation end 155 of the moving link 15 is pulled to cause itself to protrude from the first housing 11, the first connector 16 can be moved by the setting members 161 of the first connector 16 along the guiding movement grooves 152 of the connector setting portion 151, at which time the first connector 16 is moved relative to the connector setting portion 151, whereby the first connector 16 is built in the connector setting portion 151, as shown that FIG. 8A and FIG. 8B are converted to FIG. 9A and FIG. 9B. It's worth noting that the moving direction of the moving link 15 is perpendicular to the moving direction of the first connector 16.

Relatively speaking, the second operation end 155 of the moving link 15 is pushed to cause itself not to protrude from the first housing 11 or the first operation end 154 of the moving link 15 is pulled to cause itself not to be set in an inner part of the first concave portion 113 of the first housing 11, the first connector 16 can be moved by the setting members 161 of the first connector 16 along the guiding movement grooves 152 of the connector setting portion 151, at which time the first connector 16 is moved relative to the connector setting portion 151, whereby the first connector 16 protrudes from the connector setting portion 151, as shown that FIG. 9A and FIG. 9B are converted to FIG. 8A and FIG. 8B. It is worth noting that the moving direction of the moving link 15 is perpendicular to the moving direction of the first connector 16.

Figure 10A:
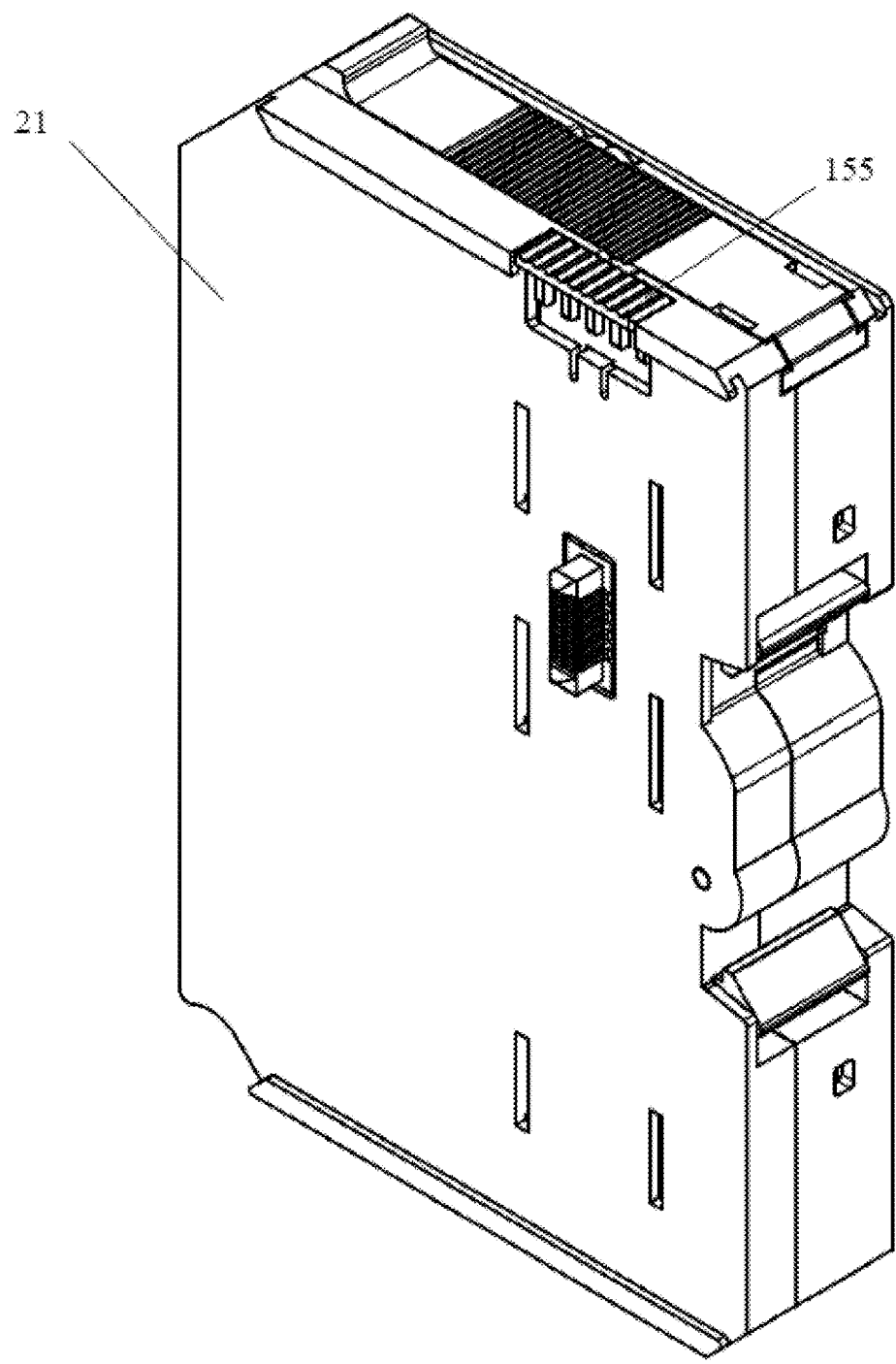
FIG. 10A is a three-dimensional view of the industrial input/output device with movable connector of the present invention from a first perspective.
Figure 10B:
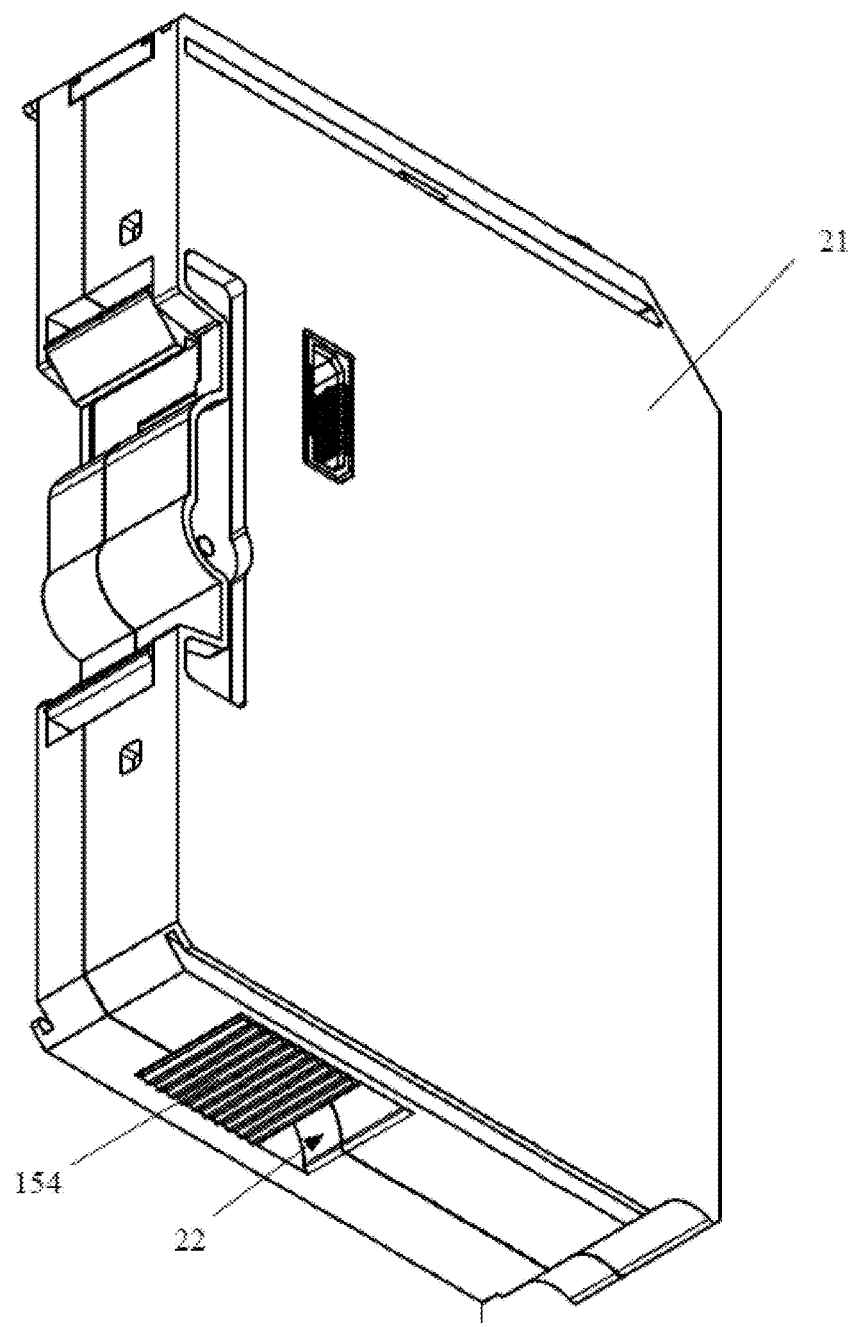
FIG. 10B is a three-dimensional view of the industrial input/output device with movable connector of the present invention from a second perspective.
Figure 11A:
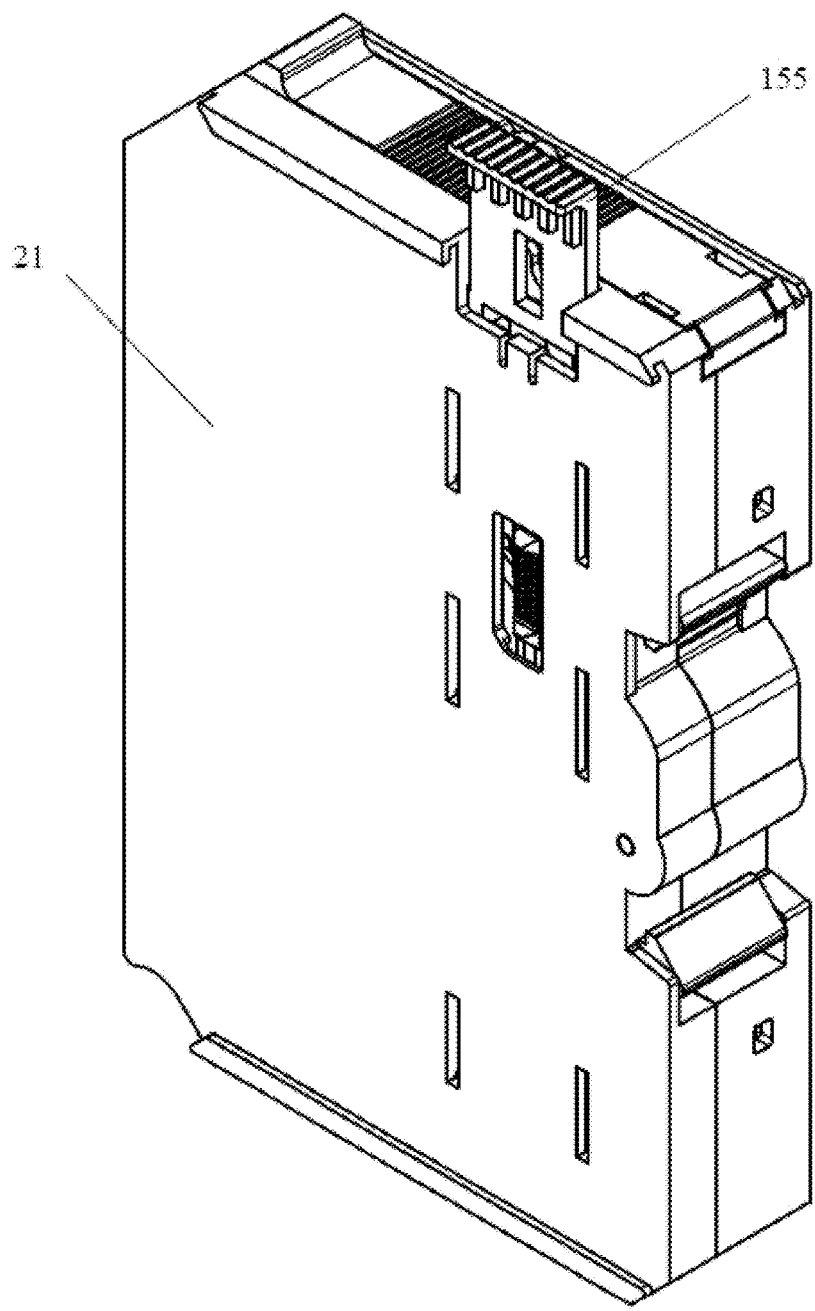
FIG. 11A is a three-dimensional view of operating the moving link of the industrial input/output device with movable connector of the present invention from a first perspective.
Figure 11B:
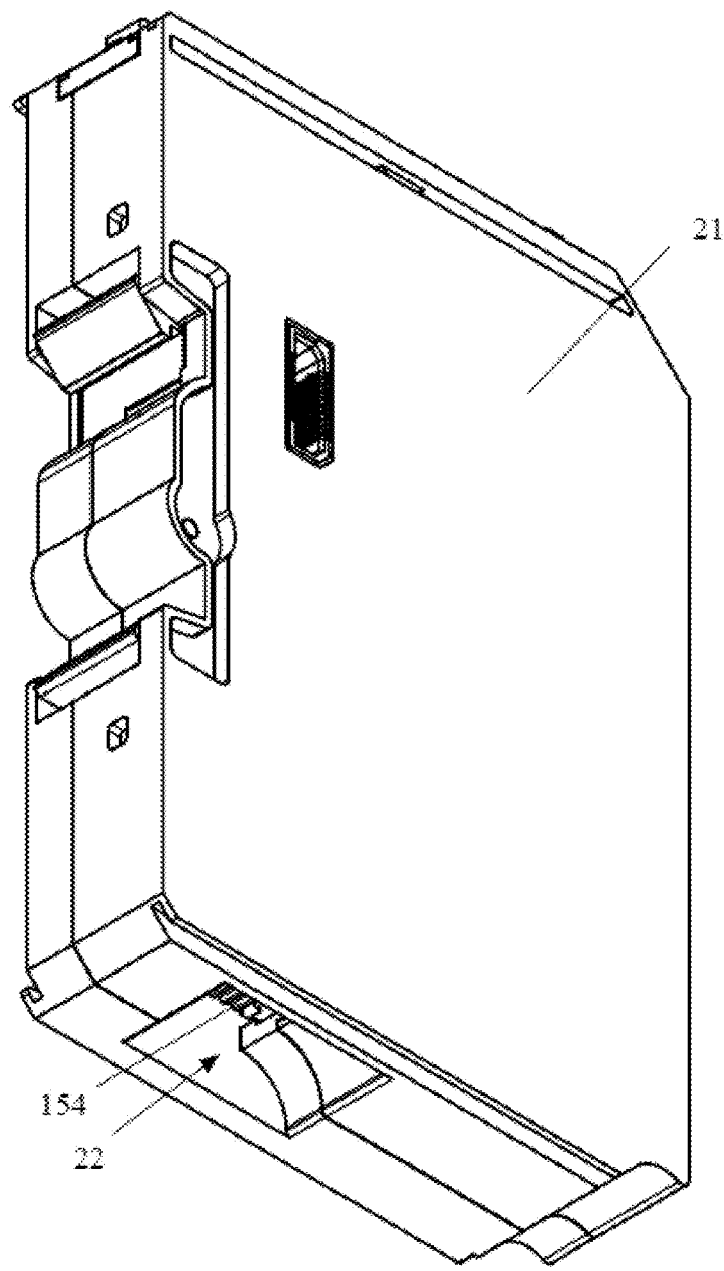
FIG. 11B is a three-dimensional view of operating the moving link of the industrial input/output device with movable connector of the present invention from a second perspective.

Please refer to FIG. 10A, FIG. 10B, FIG. 11A and FIG. 11B, wherein FIG. 10A is a three-dimensional view of the industrial input/output device with movable connector of the present invention from a first perspective; FIG. 10B is a three-dimensional view of the industrial input/output device with movable connector of the present invention from a second perspective; FIG. 11A is a three-dimensional view of operating the moving link of the industrial input/output device with movable connector of the present invention from a first perspective; and FIG. 11B is a three-dimensional view of operating the moving link of the industrial input/output device with movable connector of the present invention from a second perspective.

The first housing 11, the second housing 12, the circuit board 13, the moving link 15, and the first connector 16 can be combined to be the industrial input/output device of the present invention, as shown in FIG. 10A, FIG. 10B, FIG. 11A, and FIG. 11B. The second operation end 155 of the moving link 15 is disposed on the moving-link setting portion 114 of the first housing 11, and the first operation end 154 of the moving link 15 is disposed in the cavity 22 of the device housing 21, and the first housing 11, the second housing 12, and the moving link 15 are made of metal material or polymer material. The metal material is, for example, iron, iron alloy, aluminum alloy, etc., and the polymer material is, for example, polyethylene (PE), urea formaldehyde resin, etc., which are merely exemplified herein, and are not intended to limit the application of the present invention.

When the first operation end 154 of the moving link 15 is pushed into the cavity 11 of the device housing 21 or the second operating end 155 of the moving link 15 is pulled to cause itself to protrude from the device housing 21, the first connector 16 can be moved by the setting members 161 of the first connector 16 along the guiding movement grooves 152 of the connector setting portion 151, at which time the first connector 16 is moved relative to the connector setting portion 151, whereby the first connector 16 is built in the device housing 21, as shown that FIG. 10A and FIG. 10B are converted to FIG. 11A and FIG. 11B. It's worth noting that the moving direction of the moving link 15 is perpendicular to the moving direction of the first connector 16.

Relatively speaking, the second operation end 155 of the moving link 15 is pushed to cause itself not to protrude from the device housing 21 or the first operation end 154 of the moving link 15 is pulled cause itself not to be set in the cavity 22 of the device housing 21, the first connector 16 can be moved by the setting members 161 of the first connector 16 along the guiding movement grooves 152 of the connector setting portion 151, at which time the first connector 16 is moved relative to the connector setting portion 151, whereby the first connector 16 protrudes from the connector setting portion 151, as shown that FIG. 11A and FIG. 11B are converted to FIG. 10A and FIG. 10B. It is worth noting that the moving direction of the moving link 15 is perpendicular to the moving direction of the first connector 16.

Figure 12A:
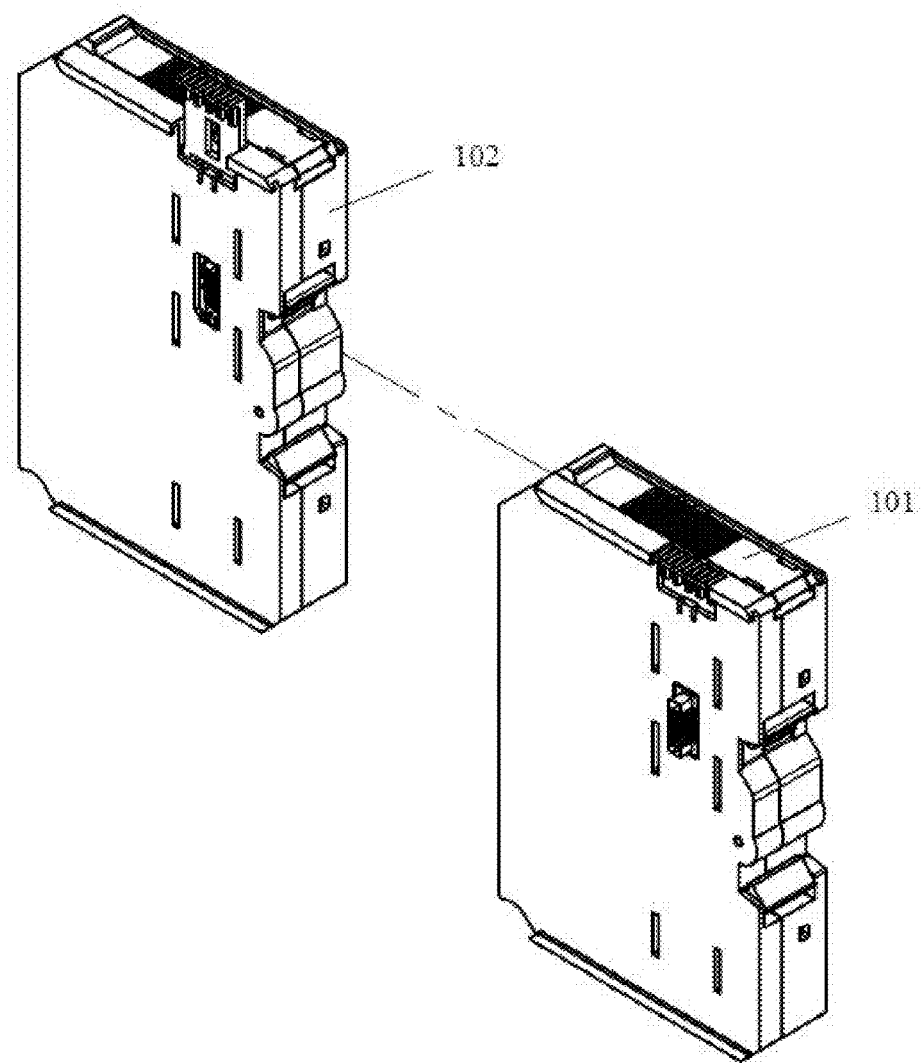
FIGS. 12A-12C are three-dimensional views of an assembling process of the industrial input/output device with movable connector of the present invention.
Figure 12B:
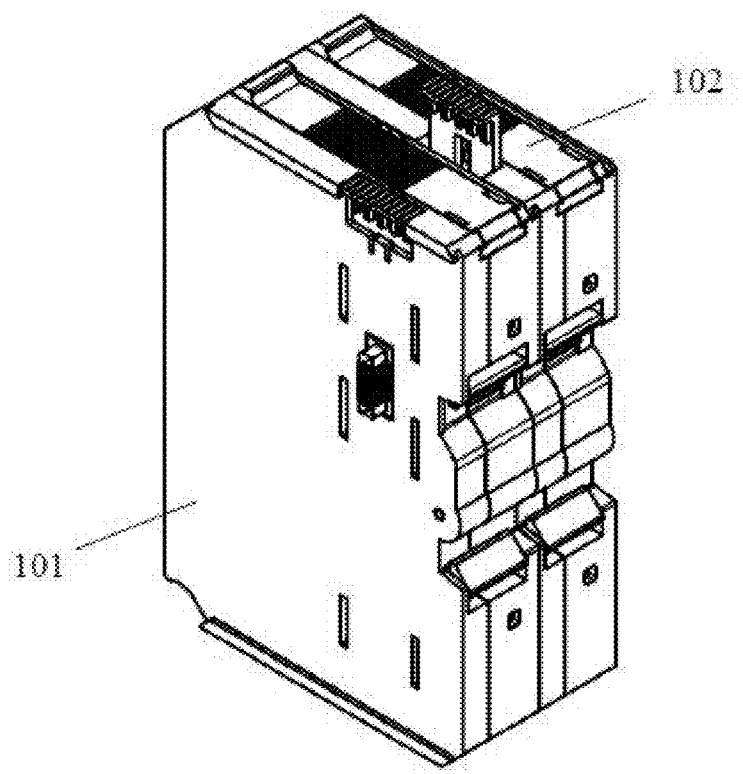
Figure 12C:
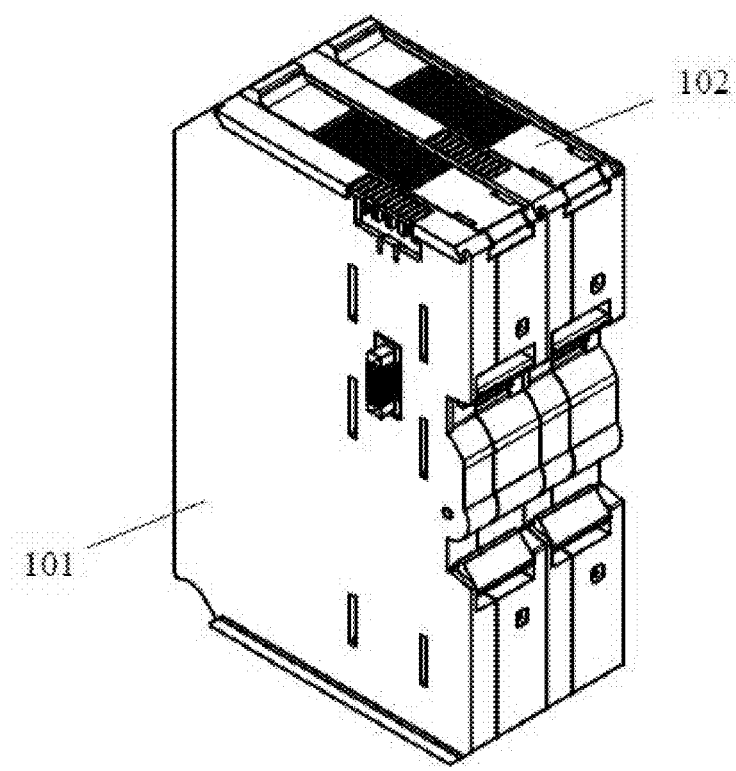

Please refer to FIGS. 12A-12C, which are three-dimensional views of an assembling process of the industrial input/output device with movable connector of the present invention.

From FIG. 12A to FIG. 12C, there is a process of assembling the first industrial input/output device 101 and the second industrial input/output device 102. When the first industrial input/output device 101 and the second industrial input/output device 102 are to be assembled, the moving link of the second industrial input/output device 102 is operated to make itself protrude from the device housing of the second industrial input/output device 102, so that the first connector of the second industrial input/output device 102 is built in the device housing of the second industrial input/output device 102.

When the second industrial input/output device 102 is moved and attached to the first industrial input/output device 101, the first connector through hole of the second industrial input/output device 102 and the second connector through hole of the first industrial input/output device correspond to each other, and the moving link of the second industrial input/output device 102 is operated such that the moving link does not protrude from the device housing of the second industrial input/output device 102 to make the first connector of the second input/output device 102 be plugged into the second connector of the first industrial input/output device 101, whereby the second industrial input/output device 102 and the first industrial input/output device 101 are electrically connected to each other.

From FIG. 12C to FIG. 12A, there is a process of separating the first industrial input/output device 101 and the second industrial input/output device 102 assembled together. When the first industrial input/output device 101 and the second industrial input/output device 102 are disassembled, the moving link of the second industrial input/output device 102 is operated to make the moving link protrude from the device housing of the second industrial input/output device 102 to make the first connector of the second industrial input/output device 102 be unplugged from the second connector of the first industrial input/output device 101. That is, the first connector of the second industrial input/output device 102 is built in the device housing of the second industrial input/output device 102, and the second industrial input/output device 102 is no longer electrically connected to the first industrial input/output device 101, so that the second industrial input/output device 102 can be moved relative to the first industrial input/output device 101, whereby the second industrial input/output device 102 can be disassembled from the first industrial input/output device 101.

Figure 13A:
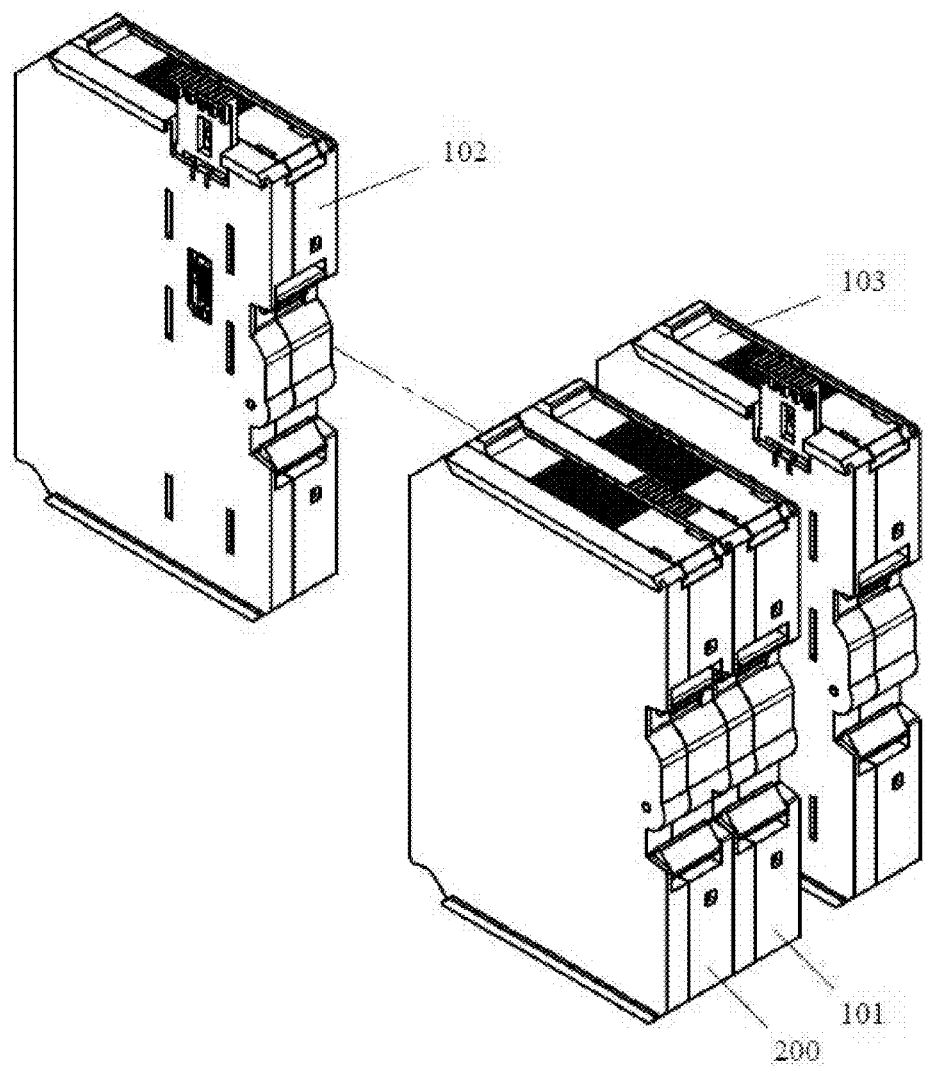
FIGS. 13A-13C are three-dimensional views of a process of assembling a plurality of the industrial input/output devices of the present invention and a control device.
Figure 13B:
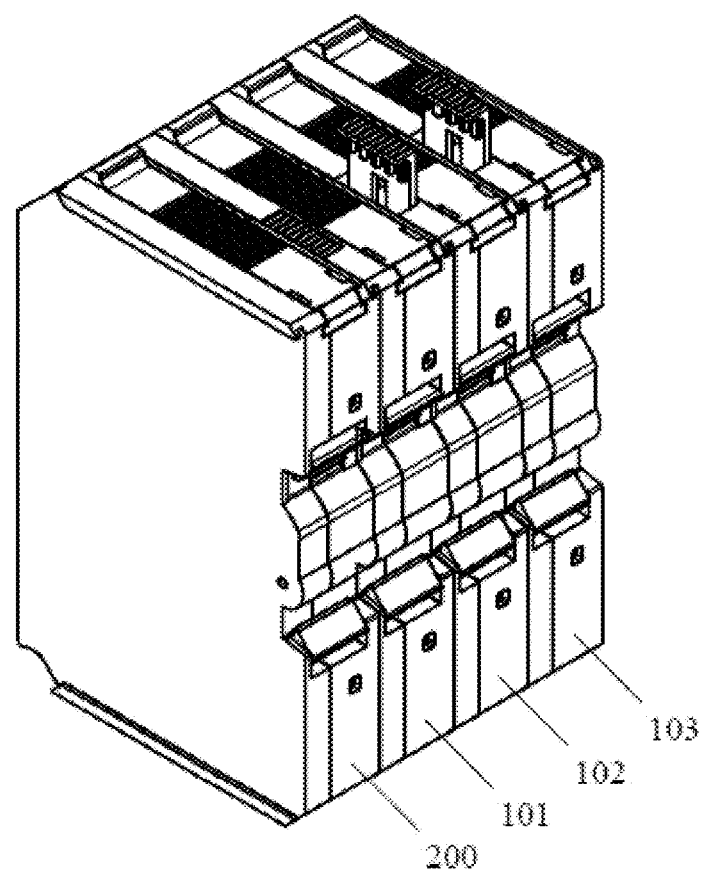
Figure 13C:
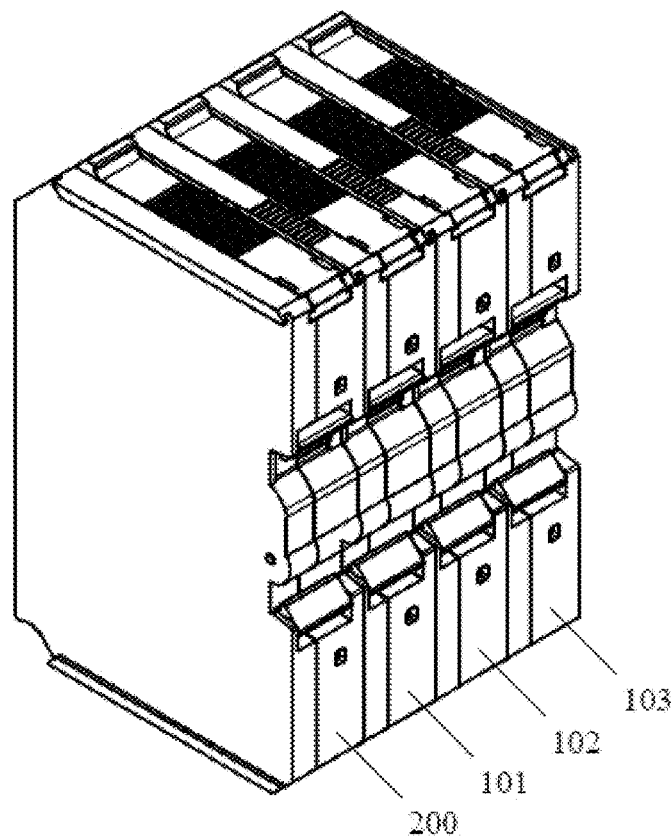

Please refer to FIGS. 13A-13C, which are three-dimensional views of a process of assembling a plurality of the industrial input/output devices of the present invention and a control device.

From FIG. 13A to FIG. 13C, there is a process for assembling the first industrial input/output device 101 and the second industrial input/output device 102, and the moving link of the first industrial input/output device 101 does not protrude from the device housing of the first industrial input/output device 101 (that is, the first connector of the first industrial input/output device 101 and the control connector of the control device 200 are correspondingly inserted with each other), thereby making the first industrial input/output device 101 be electrically connected to the control device 200.

The moving link of the second industrial input/output device 102 is controlled to protrude from the device housing of the second industrial input/output device 102 (that is, the first connector of the second industrial input/output device 102 is built in the device housing of the second industrial input/output device 102).

The moving link of the third industrial input/output device 103 is controlled to protrude from the device housing of the third industrial input/output device 103 (that is, the first connector of the third industrial input/output device 103 is built in the device housing of the third industrial input/output device 103).

When the second industrial input/output device 102 is moved and attached to the first industrial input/output device 101 and the third industrial input/output device 103, the moving link of the second industrial input/output device 102 is operated again not to protrude from the device housing of the second industrial input/output device 102, so that the first connector of the second industrial input/output device 102 is plugged into the second connector of the first industrial input/output device 101, and the moving link of the third industrial input/output device 103 is operated not to protrude from the device housing of the third industrial input/output device 103, so that the first connector of the third industrial input/output device 103 is plugged into the second connector of the second industrial input/output device 102, whereby the control device 200, the first industrial input/output device 101, the second industrial input/output device 102, and the third industrial input/output device 103 are electrically connected to each other and the first industrial input/output device 101, the second industrial input/output device 102, and the third industrial input/output device 103 can obtain power supply from the control device 200 and are controlled by the control device 200.

From FIG. 13C to FIG. 13A, there is a process of separating the second industrial input/output device 102, the first industrial input/output device 101, and the second industrial input/output device 103 assembled together. When the second industrial input/output device 102, the first industrial input/output device 101 and the third industrial input/output device 103 are disassembled, the moving link of the second industrial input/output device 102 is operated to cause the moving link to protrude from the device housing of the second industrial input/output device 102, and the moving link of the third industrial input/output device 103 is also operated to cause the moving link to protrude from the device housing of the third industrial input/output device 103, so that the first connector of the second input/output device 102 is unplugged from the second connector of the first industrial input/output device 101, and the second connector of the second industrial input/output device 102 is unplugged from into the first of the third industrial input/output device 103, and the first connector of the second industrial input/output device 102 is built in the device housing of the second industrial input/output device 102, and the first connector of the third industrial input/output device 103 is built in the device housing of the third industrial input/output device 103, and the second industrial input/output device 102 and the third industrial input/output device 103 are no longer electrically connected. Thus, the second industrial input/output device 102 is movable relative to the first industrial input/output device 101 and the third industrial input/output device 103, whereby the second industrial input/output device 102 can be disassembled from the first industrial input/output device 101 and the third industrial input/output device 103.

In the drawings of the present invention, the first connector is illustrated by a male connector, and the second connector is illustrated by a female connector, but the invention is not limited thereto, that is, the first connector may be a female connector, and the second connector may be a male connector, and the first connector and the second connector may adopt the interface, such as RS232, USB, etc. as a connector implementation. This is for illustrative purposes only and is not intended to limit the scope of application of the invention.

As described above, it can be known that the difference between the present invention and the prior art is that the industrial input/output device with movable connector is controlled to make the first connector provide connection or not by moving the moving link thereof, thereby avoiding the problem of the interruption of the operation of the industrial input/output device.

By aforementioned technology means, the present invention may solve the problem that the existing industrial input/output device with serial interface can be extracted at any time, thereby causing the operation of the industrial input/output device to be interrupted, and achieve the technical effect of preventing the interruption of the operation of the industrial input/output device.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:
1. An industrial input/output device with movable connector, comprising:

a first housing, having a first connector through hole, a first concave portion, a moving-link setting portion, and a plurality of moving guides on an inner surface thereof;

a second housing, assembled with the first housing, and having an accommodation space, a second connector through hole, and a second concave portion, wherein a position of the second connector through hole corresponds to that of the first connector through hole;

a circuit board, disposed in the accommodation space, and provided with a second connector, which is exposed to the second housing through the second connector through hole when the circuit board is disposed in the accommodation space;

a moving link, set on the first housing by passing through the moving-link setting portion, and moved relative to the first housing by the moving-link setting portion and the plurality of moving guides, and having a connector setting portion, which has two sets of guiding movement grooves provided on both sides thereof, and a connecting through hole, which is provided at a bottom thereof; and a first connector, having setting members, a number and positions of which correspond to those of the guiding movement grooves, wherein the setting members are disposed in the guiding movement grooves corresponding thereto to make the first connector be disposed in the connector setting portion, and the first connector is exposed to the first housing when the moving link is set on the first housing by passing through the moving-link setting portion, and the first connector electrically connects to the circuit board through the connecting through hole;

wherein the moving link is disposed on the first housing, the second housing and the first housing are assembled with each other as a device housing, the first concave portion and the second concave portion form a cavity, a first operation end of the moving link is disposed to the cavity, and a second operation end of the moving link is disposed to the moving-link setting portion.

2. The industrial input/output device with movable connector according to claim 1, wherein when the first operation end is pushed into an inner part of the cavity or the second operation end is pulled to cause itself to protrude from the device housing, the setting members of the first connector moves along the guiding movement grooves, so that the first connector is moved relative to the connector setting portion, whereby the first connector is built in the device housing.

3. The industrial input/output device with movable connector according to claim 1, wherein when the second operation end is pushed to cause itself not to protrude from the device housing or the first operation end is pulled to cause itself not to be set in an inner part of the cavity, the setting members of the first connector moves along the guiding movement grooves, so that the first connector is moved relative to the connector setting portion, whereby the first connector protrudes from the device housing.

4. The industrial input/output device with movable connector according to claim 1, wherein the first connector protrudes from the industrial input/output device by pushing the moving link, and the first connector, which protrudes from the industrial input/output device, electrically connects to the second connector of the adjacent industrial input/output device.

5. The industrial input/output device with movable connector according to claim 1, wherein the first connector is built in the industrial input/output device by pushing the moving link, and the first connector, which is built in the industrial input/output device, and the second connector of the adjacent industrial input/output device are electrically disconnected.

6. The industrial input/output device with movable connector according to claim 1, wherein the first connector is a male connector and the second connector is a female connector, or the first connector is a female connector and the second connector is a male connector.

7. The industrial input/output device with movable connector according to claim 1, wherein a moving direction of the moving link is perpendicular to that of the first connector.

8. The industrial input/output device with movable connector according to claim 1, wherein each of the guiding movement grooves is a track with horizontal planes at both ends and an inclined plane in the middle.

9. The industrial input/output device with movable connector according to claim 1, wherein the first housing, the second housing and the moving link are made of metal material or polymer material.

* * * * *